United States Patent
Kogita et al.

(10) Patent No.: US 9,965,202 B2
(45) Date of Patent: May 8, 2018

(54) NON-VOLATILE STORAGE DEVICE, NON-VOLATILE STORAGE SYSTEM, AND MEMORY CONTROL METHOD WITH A REFRESH PROCESSING OF A DATA

(71) Applicant: Panasonic Intellectual Property Management Co., Ltd., Osaka (JP)

(72) Inventors: Shigekazu Kogita, Osaka (JP); Hirokazu So, Kyoto (JP); Toshiyuki Honda, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 26 days.

(21) Appl. No.: 15/079,959

(22) Filed: Mar. 24, 2016

(65) Prior Publication Data

US 2016/0283150 A1 Sep. 29, 2016

(30) Foreign Application Priority Data

Mar. 26, 2015 (JP) ................. 2015-064590

(51) Int. Cl.
*G06F 3/06* (2006.01)
*G11C 16/34* (2006.01)
(Continued)

(52) U.S. Cl.
CPC .......... *G06F 3/0619* (2013.01); *G06F 3/0653* (2013.01); *G06F 3/0679* (2013.01);
(Continued)

(58) Field of Classification Search
CPC .... G06F 3/0619; G06F 3/0653; G06F 3/0679; G11C 16/10; G11C 16/26; G11C 16/3431
See application file for complete search history.

(56) References Cited

U.S. PATENT DOCUMENTS

2012/0163097 A1 6/2012 Ishikawa et al.
2013/0185606 A1* 7/2013 Fai ...................... G06F 11/1068
714/704
(Continued)

FOREIGN PATENT DOCUMENTS

| JP | 2009-512119 A | 3/2009 |
| JP | 2012-133642 A | 7/2012 |
| WO | 2007/047110 A1 | 4/2007 |

*Primary Examiner* — Reginald G Bragdon
*Assistant Examiner* — Edward Wang
(74) *Attorney, Agent, or Firm* — McDermott Will & Emery LLP

(57) ABSTRACT

A non-volatile storage device of the present disclosure includes non-volatile memory configured to have a plurality of areas for storing data, and a memory controller configured to write the data to the non-volatile memory and to read the data from the non-volatile memory. The memory controller includes a memory interface (I/F) connected to the non-volatile memory, a threshold calculator calculating a threshold for the number of error bits of the data based on a storage condition in the case of storing the data in the non-volatile memory without power, and a refresh controller determining whether refresh processing of the data is necessary, based on the threshold and the number of error bits of the data, and executing the refresh processing of the data if the refresh processing of the data is necessary.

9 Claims, 9 Drawing Sheets

(51) Int. Cl.
*G11C 16/10* (2006.01)
*G11C 16/26* (2006.01)

(52) U.S. Cl.
CPC .......... *G11C 16/3431* (2013.01); *G11C 16/10* (2013.01); *G11C 16/26* (2013.01)

(56) References Cited

U.S. PATENT DOCUMENTS

2015/0242143 A1* 8/2015 Kim ...................... G06F 3/0619
 714/704
2016/0172021 A1* 6/2016 Ishizu ................... G11C 11/403
 365/63

* cited by examiner

| Threshold | High threshold ⟷ Low threshold |
|---|---|
| Time information | Short time ⟷ Long time |
| Temperature information | Low temperature ⟷ High temperature |
| Importance information of target area | Low importance ⟷ High importance |
| The number of times of rewriting memory | Low count ⟷ High count |

NON-VOLATILE STORAGE DEVICE, NON-VOLATILE STORAGE SYSTEM, AND MEMORY CONTROL METHOD WITH A REFRESH PROCESSING OF A DATA

RELATED APPLICATIONS

This application claims the benefit of priority of Japanese Application No. 2015-064590, filed on Mar. 26, 2015, the disclosure of which is incorporated by reference herein.

BACKGROUND OF THE INVENTION

1. Field of the Invention

The present disclosure relates to a non-volatile storage device, such as a Solid State Drive (SSD) or a semiconductor memory card, having rewritable non-volatile memory such as flash memory as a data storage medium, a non-volatile storage system including the non-volatile storage device, and a memory control method for non-volatile memory.

2. Description of the Related Art

A non-volatile storage device having a rewritable non-volatile memory such as flash memory is widely used as an SSD and a semiconductor memory card, for example. The non-volatile storage device is much in demand as non-volatile storage system combining the non-volatile storage device with AV equipment such as a personal computer and a digital camera.

The SSD and the semiconductor memory card include a flash memory to store data and a memory controller to control the flash memory. The memory controller is a device for controlling reading data from the flash memory and writing data to the flash memory, according to a read instruction of data and a write instruction of data from an access apparatus such as the personal computer or the digital camera. The memory controller typically performs controls such as defect management, wear leveling (leveling of the number of times of rewriting), and error correction processing by Error Correcting Code (ECC), to the flash memory. A typical type of the flash memory is a NAND type.

In recent years, a data retention period of the flash memory tends to be short due to semiconductor manufacturing process shrink and multi-level memory cells. A method disclosed in Patent Literature 1, for example, for this problem. This method is that a non-volatile storage device performs a refresh operation in accordance with a result of comparison between urgency of a level set for execution of refresh operation and a level of a data change state. This method allows the non-volatile storage device to prevent reduction in a processing speed and perform an appropriate refresh operation according to situations.

CITATION LIST

Patent Literature

PTL 1: Unexamined Japanese Patent Publication No. 2012-133642

However, when data is stored in the non-volatile memory of a non-volatile storage device without power for a long period, a change of a state of the stored data during that period is in danger of difficulty of retaining the data.

SUMMARY OF THE INVENTION

The present disclosure provides a non-volatile storage device, a non-volatile storage system, and a memory control method for achieving more reliable retention of data in a long period of storage in the non-volatile storage device.

A non-volatile storage device of the present disclosure includes non-volatile memory configured to have a plurality of areas for storing data, and a memory controller configured to write the data to the non-volatile memory and to read the data from the non-volatile memory. The memory controller includes a memory interface (I/F) connected to the non-volatile memory, a threshold calculator calculating a threshold for the number of error bits of the data based on a storage condition in the case of storing the data in the non-volatile memory without power, and a refresh controller determining whether refresh processing of the data is necessary, based on the threshold and the number of error bits of the data, and executing the refresh processing of the data if the refresh processing of the data is necessary.

The non-volatile storage device, the non-volatile storage system, and the memory control method of the present disclosure can achieve more reliable retention of data in a long period of storage in the non-volatile storage device.

DETAILED DESCRIPTION OF THE PREFERRED EMBODIMENTS

Hereinafter, with reference to the drawings as appropriate, exemplary embodiments will be described in detail. However, unnecessarily detailed descriptions will not be provided. For example, detailed descriptions of well-known matters and redundant descriptions of substantially identical configurations will not be provided. This is to prevent the following description from being unnecessarily redundant, and to facilitate the understanding of those skilled in the art.

The accompanying drawings and the following description are provided for those skilled in the art to fully understand the present disclosure, and are not intended to limit subjects described in the claims.

First Exemplary Embodiment

Hereinafter, with reference to FIGS. 1 to 8, a first exemplary embodiment will be described.

[1-1. Configuration]
[1-1-1. Configuration of Non-Volatile Storage Device]

Figure 1:
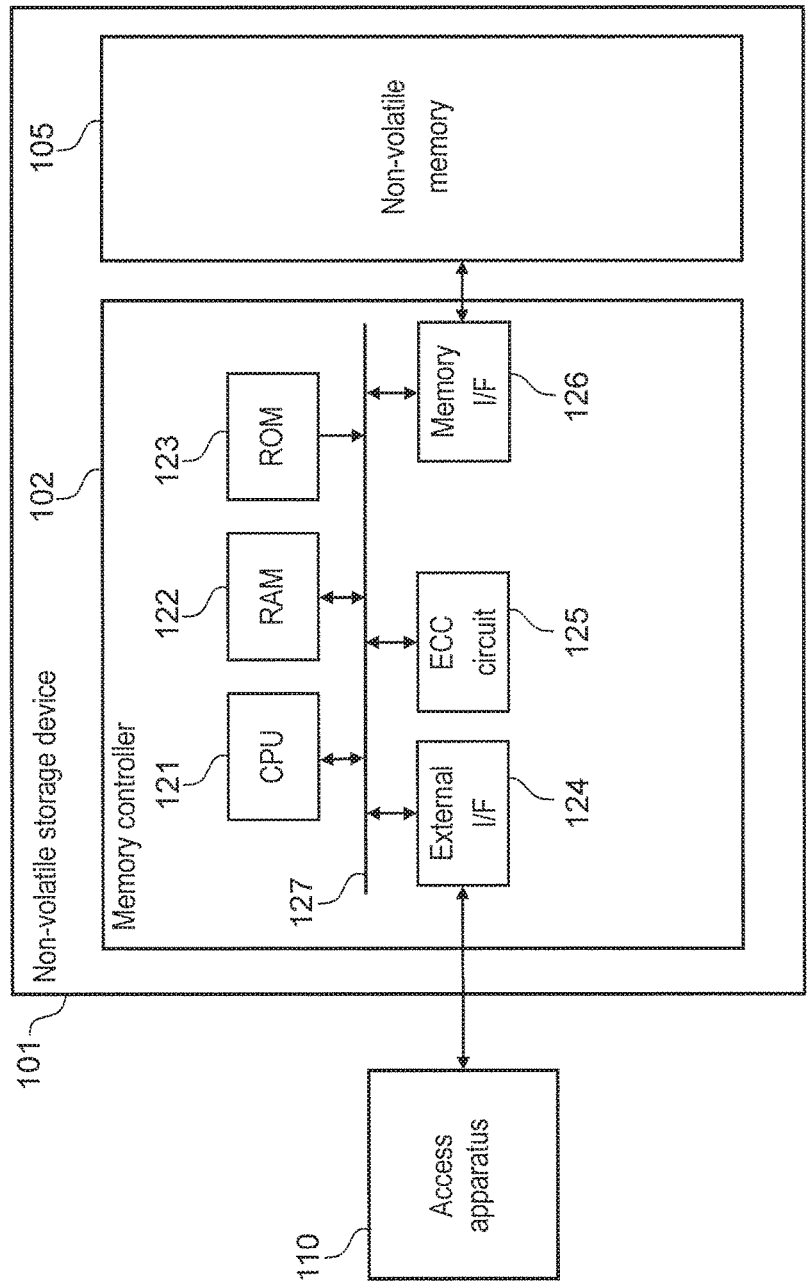
FIG. 1 is a block diagram of a non-volatile storage system in a first exemplary embodiment.

FIG. 1 is a block diagram of non-volatile storage system 100 in the first exemplary embodiment. Non-volatile storage system 100 includes non-volatile storage device 101 and access apparatus 110. In FIG. 1, a hardware configuration of non-volatile storage device 101 is shown. Non-volatile storage device 101 includes memory controller 102 and non-volatile memory 105. Non-volatile memory 105 is a semiconductor memory, and stores data. Memory controller 102 controls to write data to non-volatile memory 105 and to read data from non-volatile memory 105.

Non-volatile storage device 101 is connected to access apparatus 110. Non-volatile storage device 101 writes data to non-volatile memory 105 and reads data from non-volatile memory 105, according to a command from access apparatus 110.

Non-volatile storage device 101 receives a refresh start command from access apparatus 110 in refresh processing as described below.

Here, the refresh processing is to rewrite data stored in non-volatile memory 105 to a different area in non-volatile memory 105 to prevent the data from being lost by reduction of charges stored in a memory cell due to time-dependent change.

Memory controller 102 includes Central Processing Unit (CPU) 121, Random-Access Memory (RAM) 122, Read-Only Memory (ROM) 123, external interface (I/F) 124, Error Correcting Code (ECC) circuit 125, and memory I/F 126, which are connected via bus 127.

CPU 121 executes programs stored in RAM 122 and ROM 123. RAM 122 is used as a storage area of programs to be executed by CPU 121, and also as a work area of parameters to be changed appropriately during execution of programs. ROM 123 is used as a storage area of programs to be executed by CPU 121, and also as a storage area of fixed data such as operation parameters when programs are executed.

External I/F 124 is an interface connected to access apparatus 110 to transmit data and receive data and the like.

ECC circuit 125 detects an error of data stored in non-volatile memory 105 and corrects the error of the data.

Memory I/F 126 is an interface connected to non-volatile memory 105 to write data and read data.

CPU 121 controls RAM 122, ROM 123, external I/F 124, ECC circuit 125, and memory I/F 126 via bus 127.

Figure 2:
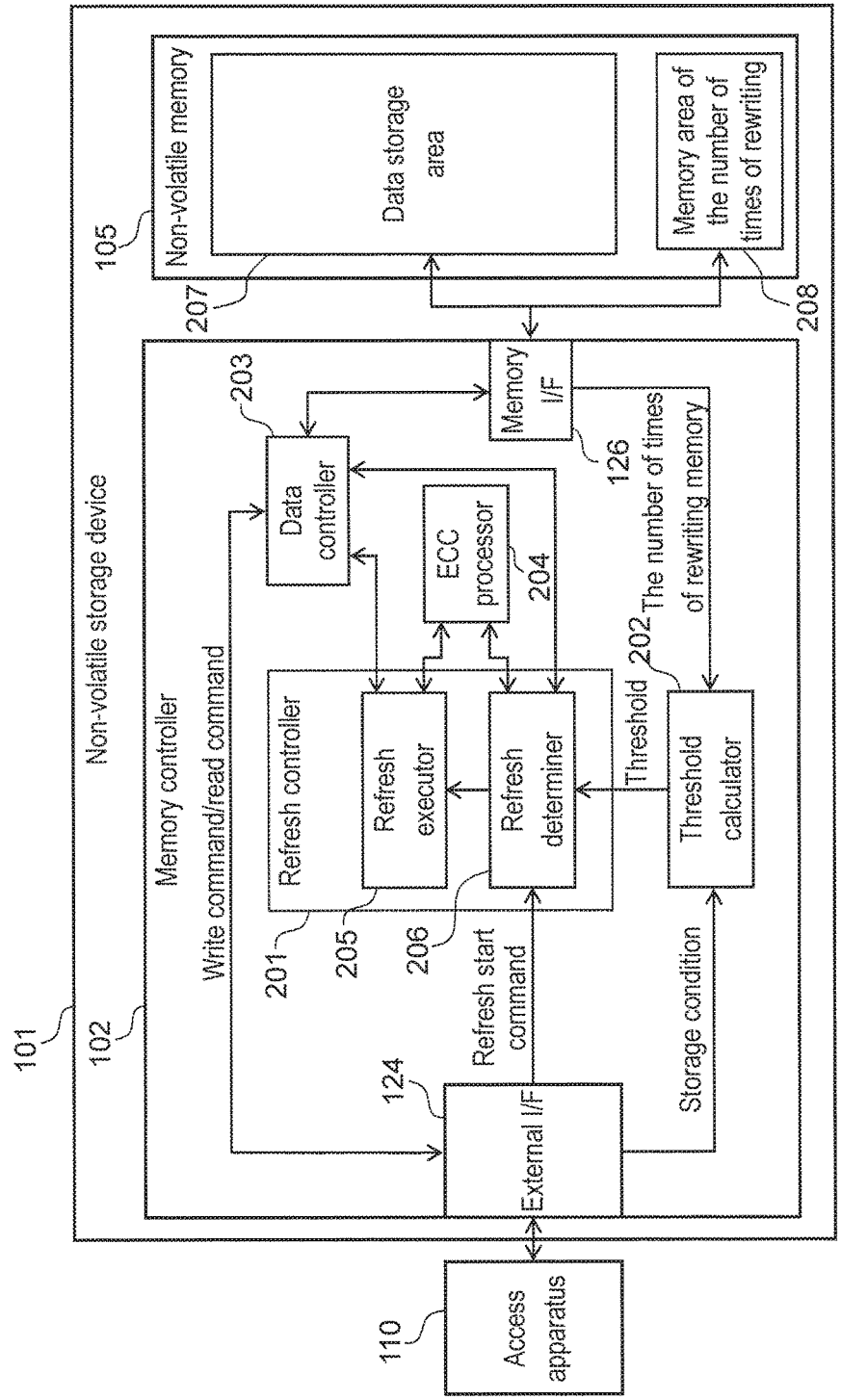
FIG. 2 is a functional block diagram of a non-volatile storage device in the first exemplary embodiment.

FIG. 2 is a functional block diagram of non-volatile storage device 101 in this exemplary embodiment.

Memory controller 102 includes refresh controller 201, threshold calculator 202, data controller 203, ECC processor 204, external I/F 124, and memory I/F 126. Refresh controller 201 includes refresh executor 205 and refresh determiner 206. ECC processor 204 is ECC circuit 125.

Non-volatile memory 105 includes data storage area 207 and memory area of the number of times of rewriting 208.

Access apparatus 110 transmits data, a write command of data and a read command of data, a refresh start command, and storage conditions, described below, to non-volatile storage device 101. Non-volatile storage device 101 receives them via external I/F 124 in memory controller 102. Data controller 203 writes data to data storage area 207 in non-volatile memory 105 and reads data to from data storage area 207 in non-volatile memory 105 via memory I/F 126, and controls non-volatile memory 105. Further, data controller 203 counts the number of times of rewriting data in non-volatile memory 105, and causes non-volatile memory 105 to store the number of times of rewriting data in memory area of the number of times of rewriting 208 via memory I/F 126.

Threshold calculator 202 receives storage conditions transmitted from access apparatus 110 via external I/F 124. Storage conditions are conditions under which non-volatile memory 105 in non-volatile storage device 101 is to be stored without power for a long period, and include time information, temperature information, and importance information of data units. Details of the storage conditions will be described below.

Here, a data unit is a unit for controlling non-volatile memory 105 by memory controller 102. The data unit is associated with data storage area 207 in non-volatile memory 105. Associated data storage area 207 is referred to as a target area. The target area includes a plurality of physical blocks. In the following description, the target area is used in place of the data unit for explanation.

Threshold calculator 202 further receives the number of times of rewriting for each target area from memory area of the number of times of rewriting 208 in non-volatile memory 105.

Threshold calculator 202 calculates a threshold for each target area based on the storage conditions and the number of times of rewriting for each target area, and outputs the threshold to refresh determiner 206.

Refresh determiner 206 receives the refresh start command via external I/F 124. Refresh determiner 206 instructs data controller 203 to read data in a target area of data storage area 207 in non-volatile memory 105. Data controller 203 reads the data in the target area of data storage area 207 in non-volatile memory 105 via memory I/F 126, based on the instruction from refresh determiner 206, and transmits the read data to refresh determiner 206. Refresh determiner 206 determines whether refresh of the data is necessary based on the data in the target area and the threshold for each target area. If refresh of the data in the target area is necessary, refresh determiner 206 instructs refresh executor 205 to refresh the target area.

Refresh executor 205 refreshes the target area.

[1-1-2. Configuration of Access Apparatus]

Figure 3:
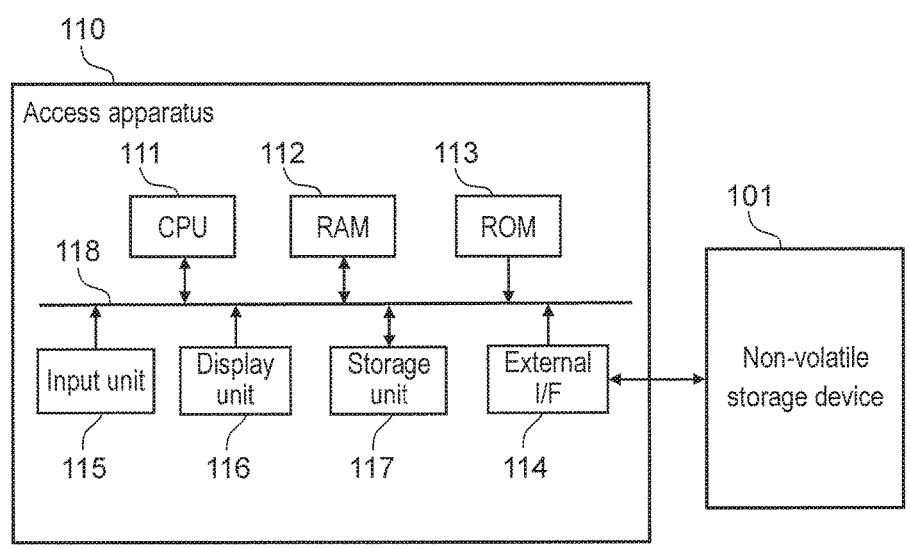
FIG. 3 is a block diagram illustrating a hardware configuration of an access apparatus in the first exemplary embodiment.

FIG. 3 is a block diagram illustrating a hardware configuration of an access apparatus in this exemplary embodiment.

Access apparatus 110 is connectable to non-volatile storage device 101, and is an electronic device such as a personal computer, a digital camera, or a television, for example.

Access apparatus 110 includes CPU 111, RAM 112, ROM 113, external I/F 114, input unit 115, display unit 116, and storage unit 117, which are connected via bus 118.

CPU 111 executes application programs and others stored in RAM 112 and ROM 113. RAM 112 is used as a storage area of programs to be executed by CPU 111, and also as a work area for parameters to be changed appropriately during execution of programs. ROM 113 is used as a storage area for programs to be executed by CPU 111, and also as a storage area for fixed data such as operation parameters when programs are executed.

External I/F 114 is an interface connected to non-volatile storage device 101, and transmits data and receives data.

Further, external I/F 114 transmits storage conditions described below to non-volatile storage device 101.

Input unit 115 includes a key, a button, a touch panel, a mouse, a keyboard, or the like which a user operates to enter various commands to CPU 111. Input unit 115 receives input of storage conditions described below by a user operation.

Display unit 116 is a liquid crystal display, an organic Electroluminescence (EL) display, or the like, for example, and displays various types of information by text, an image, or the like. Display unit 116 displays storage conditions entered by input unit 115.

Storage unit 117 includes a flash memory or a hard disk, for example, as an information storage medium and stores programs or data. Storage unit 117 stores storage conditions entered by input unit 115.

[1-1-3. Configuration of Non-Volatile Memory]

Figure 4:
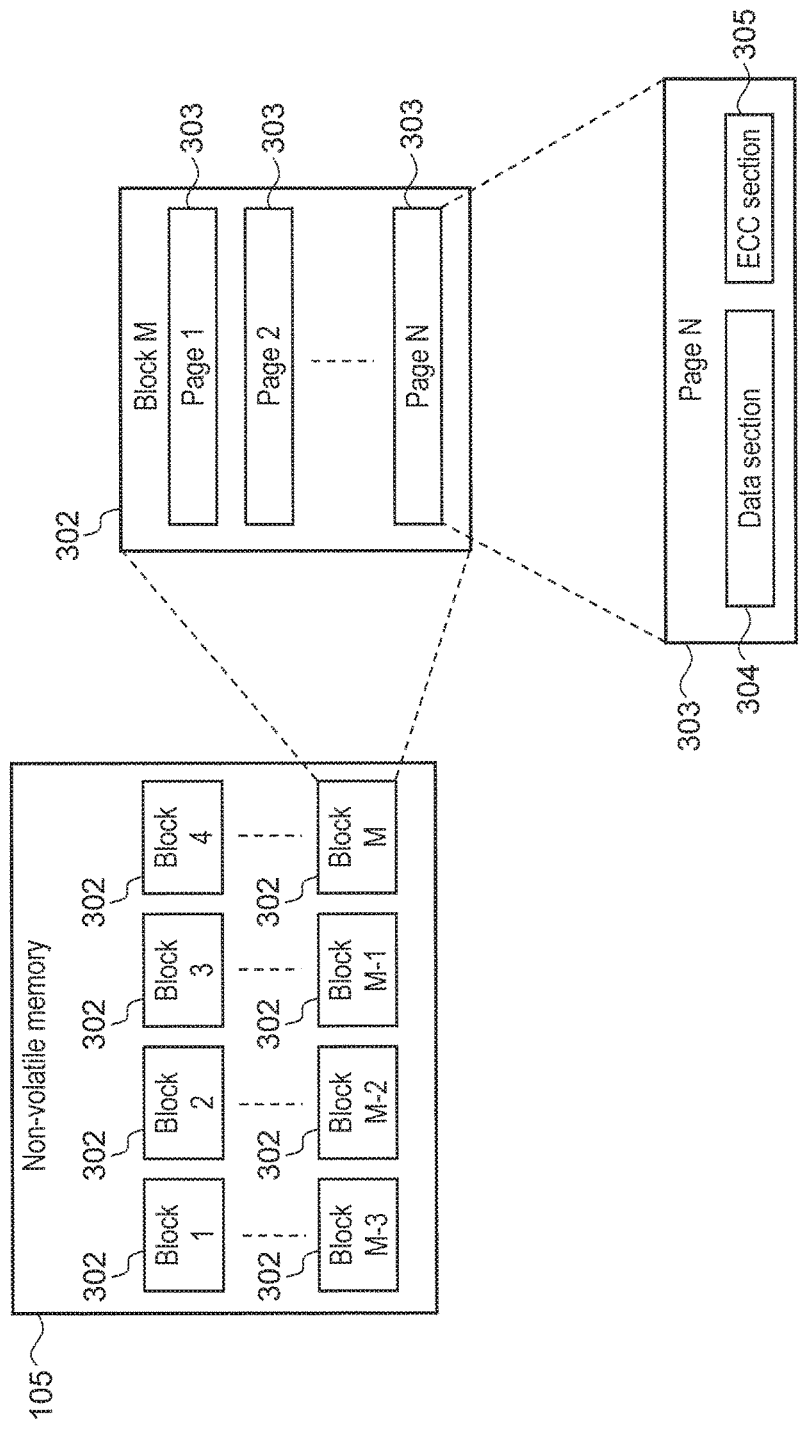
FIG. 4 is a configuration diagram of non-volatile memory in the non-volatile storage device in the first exemplary embodiment.

FIG. 4 is a configuration diagram of non-volatile memory 105 in non-volatile storage device 101 in this exemplary embodiment.

Non-volatile memory 105 includes a plurality of physical blocks 302. Specifically, non-volatile memory 105 includes block 1, block 2 . . . and block M (M is an integer not less than 1). Physical block 302 is a data erasure unit in non-volatile memory 105. Data is erased in this unit by memory controller 102.

Physical block 302 includes a plurality of pages 303. Specifically, block M includes page 1, page 2 . . . and page N (N is an integer not less than 1). Page 303 is a unit of writing data and reading data in non-volatile memory 105. When memory controller 102 writes data to non-volatile memory 105, memory controller 102 erases data on a block basis, and then writes data to pages 303 in an ascending order in block 302 in which data is erased.

Page 303 includes data section 304 and ECC section 305. Data section 304 is an area to store data transmitted from access apparatus 110. ECC section 305 is an area to store an error correcting code for data stored in data section 304. Memory controller 102 calculates the number of error bits and positions of the error bits of data stored in data section 304, based on the error correcting code stored in ECC section 305. With this, ECC processor 204 in memory controller 102 corrects the error bits of data stored in data section 304.

[1-2. Refresh Processing]

Next, refresh processing of non-volatile storage device 101 in this exemplary embodiment will be described.

[1-2-1. Variable Threshold for Long-Period Storage]

Figure 5:
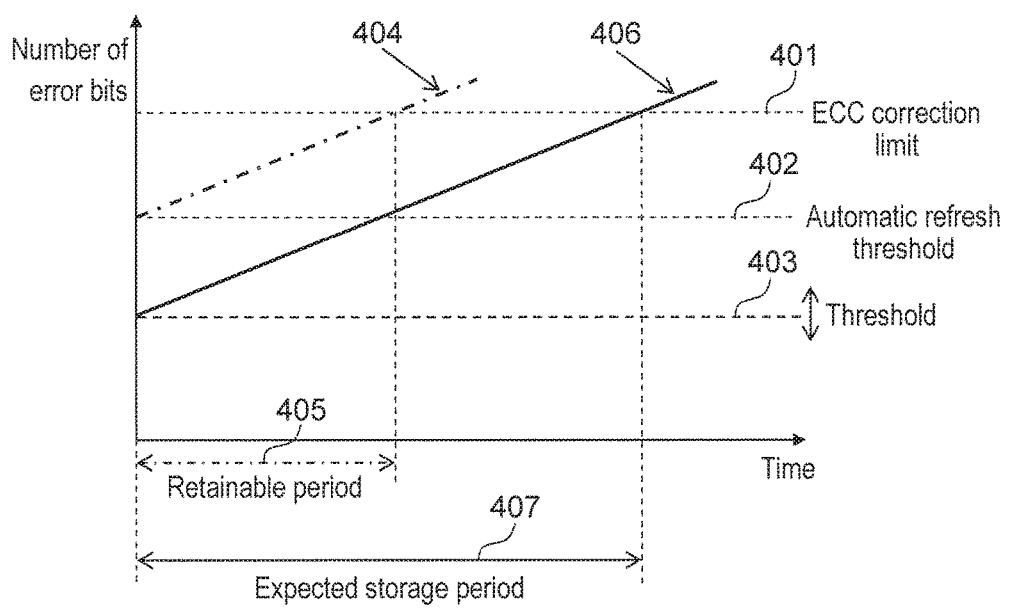
FIG. 5 is a diagram illustrating time-dependent change of the number of error bits in the non-volatile memory.

FIG. 5 is a diagram illustrating time-dependent change of the number of error bits in non-volatile memory 105. A horizontal axis represents time, and a vertical axis represents the number of error bits in non-volatile memory 105.

When the number of error bits exceeds ECC correction limit 401, ECC processor 204 cannot correct errors. Therefore, a conventional non-volatile storage device has an automatic refresh function. The automatic refresh function detects errors on the non-volatile memory when power of non-volatile memory in the conventional non-volatile storage device is changed from off to on and executes refresh processing if the number of error bits is greater than or equal to automatic refresh threshold 402. Number of error bits 404 after the automatic refresh of the non-volatile memory in the conventional non-volatile storage device increases over time from the automatic refresh threshold. Data retainable period 405 after the automatic refresh is a period from the automatic refresh until number of error bits 404 exceeds ECC correction limit 401, through a lapse of time. However, if a period for which the non-volatile memory in the conventional non-volatile storage device is stored without power exceeds data retainable period 405 after the automatic refresh, data cannot be retained.

Therefore, to lengthen retainable period 405, automatic refresh threshold 402 is set lower. When the power of the non-volatile memory in the non-volatile storage device is changed from off to on, refresh is performed at automatic refresh threshold 402 which is set lower. Consequently, frequency of rewriting data in the non-volatile memory in the non-volatile storage device increases due to the refresh processing. In the result, the non-volatile memory deteriorates rapidly.

Further, automatic refresh threshold 402 is set to zero. When the power of the non-volatile memory in the non-volatile storage device is changed from off to on, all areas of the non-volatile memory are refreshed, and retainable period 405 becomes the longest period. However, the number of times of rewriting data increases once in all areas of the non-volatile memory. In the result the non-volatile memory deteriorates rapidly.

In contrast, in this embodiment, before non-volatile memory 105 in non-volatile storage device 101 is stored without power, threshold 403 is set variably in accordance with expected storage period 407. Threshold 403 is set, and refresh processing of non-volatile memory 105 in non-volatile storage device 101 is performed, and then power of non-volatile memory 105 in non-volatile storage device 101 is turned off. In the refresh processing of non-volatile memory 105, if the number of error bits in a page of a target area is greater than or equal to threshold 403, refresh processing is executed.

Number of error bits 406 after the refresh processing of non-volatile memory 105 in non-volatile storage device 101 increases over time from threshold 403 after the refresh processing. Expected storage period 407 is a period from the refresh until number of error bits 406 exceeds ECC correction limit 401, through a lapse of time.

As described above, by setting threshold 403 in accordance with an expected storage period of non-volatile memory 105 in non-volatile storage device 101 without power, the number of error bits in a page of a target area does not exceed ECC correction limit 401 during a period of storage in non-volatile memory 105 in non-volatile storage device 101 without power, and data can be retained.

[1-2-2. Calculation of Threshold]

Figures 6A, 6B:
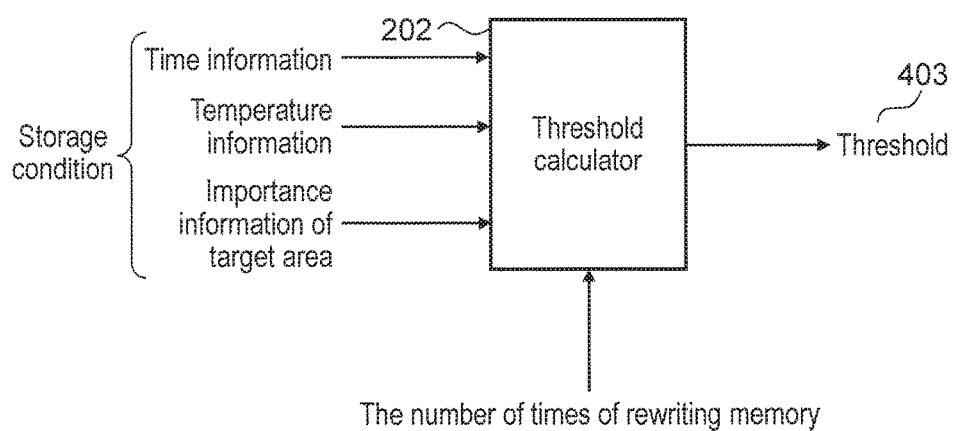
FIG. 6A is a diagram illustrating details of input information and output information of a threshold calculator in the first exemplary embodiment.
FIG. 6B is a diagram illustrating relationship between a threshold and setting of storage conditions and relationship between the threshold and setting of the number of times of rewriting memory in the threshold calculator in the first exemplary embodiment.

Next, a method for calculating threshold 403 in this exemplary embodiment will be described. FIG. 6A is a diagram illustrating details of input information and output information of threshold calculator 202 in this exemplary embodiment.

Threshold calculator 202 receives storage conditions transmitted from access apparatus 110. Threshold calculator 202 also receives the number of times of rewriting for each target area in non-volatile memory 105 from memory area of the number of times of rewriting 208, and calculates threshold 403 for each target area in non-volatile memory 105.

The storage conditions include time information, temperature information, and importance information of a target area. A user sets the storage conditions by input unit 115 in access apparatus 110.

For the time information, an expected storage period for which non-volatile memory 105 in non-volatile storage device 101 is to be stored without power is set. For example, when non-volatile memory 105 in non-volatile storage device 101 is stored in a warehouse without power for one year, "one year" is set.

For the temperature information, an expected storage temperature at which non-volatile memory 105 in non-volatile storage device 101 is to be stored without power is set. For example, when the highest temperature at the location of the warehouse where non-volatile storage device 101 is stored is 35° C., "35° C." is set.

For the importance information of target areas, importance of data contained in a target area is set. When there is data with high importance in a target area, importance of the target area is set higher than importance of other target areas. For example, when importance is set as rank 1, rank 2, . . . , rank 5 in decreasing order of importance, importance of a target area containing data with the highest importance is set to "rank 1."

When non-volatile storage device 101 is divided into a plurality of partitions and managed by access apparatus 110, for example, and importance of a particular partition is high, importance of a target area associated with data of the particular partition is set high.

By adding temperature information and importance of a target area as storage conditions besides an expected storage period as time information, the precision of calculation of threshold can be increased with respect to conditions of non-volatile memory 105 in non-volatile storage device 101 without power.

The number of times of rewriting memory is stored in memory area of the number of times of rewriting 208 for each target area in non-volatile memory 105. Memory controller 102 manages the number of times of rewriting memory. If memory controller 102 has a function of wear leveling, the number of times of rewriting is used.

Threshold 403 may be calculated for each target area, or may be calculated for all or a plurality of target areas collectively.

Data units and target areas may be dynamically associated with each other in a table in which the data units and the target areas are associated with each other. In this case, importance of data contained in a data unit is associated with importance of a target area using this table.

FIG. 6B is a diagram illustrating relationship between a threshold and setting of storage conditions and relationship between the threshold and setting of the number of times of rewriting memory in threshold calculator 202 in this exemplary embodiment.

If time information setting is relatively long, for example, time information setting is longer than a predetermined reference time, threshold calculator 202 calculates threshold 403 relatively small. This is because a period for the number of error bits to exceed ECC correction limit 401 needs to be made relatively long.

If temperature information setting is relatively high, for example, temperature information setting is higher than a predetermined reference temperature, threshold calculator 202 calculates threshold 403 relatively small. The higher the temperature, the shorter the retention time of data in non-volatile memory 105 and the more accelerating an increase of the number of error bits. Therefore a period for the number of error bits to exceed ECC correction limit 401 needs to be made relatively longer.

If setting of importance information of a target area is relatively high, for example, the importance is higher than predetermined reference importance or a measure of central tendency of all areas, for example, a mean value or a median, threshold calculator 202 calculates threshold 403 relatively small. This is to store important data more safely.

If the number of times of rewriting memory is relatively high, for example, the number of times of rewriting is higher than a predetermined reference count or a measure of central tendency of all areas, for example, a mean value or a median, threshold calculator 202 calculates threshold 403 relatively small. If the number of times of rewriting increases, an increase in the number of error bits accelerates in non-volatile memory 105 and the data retention period is shorten. Therefore a period for the number of error bits to exceed ECC correction limit 401 needs to be made relatively long.

[1-2-3. Refresh Determination Processing]

Figure 7:
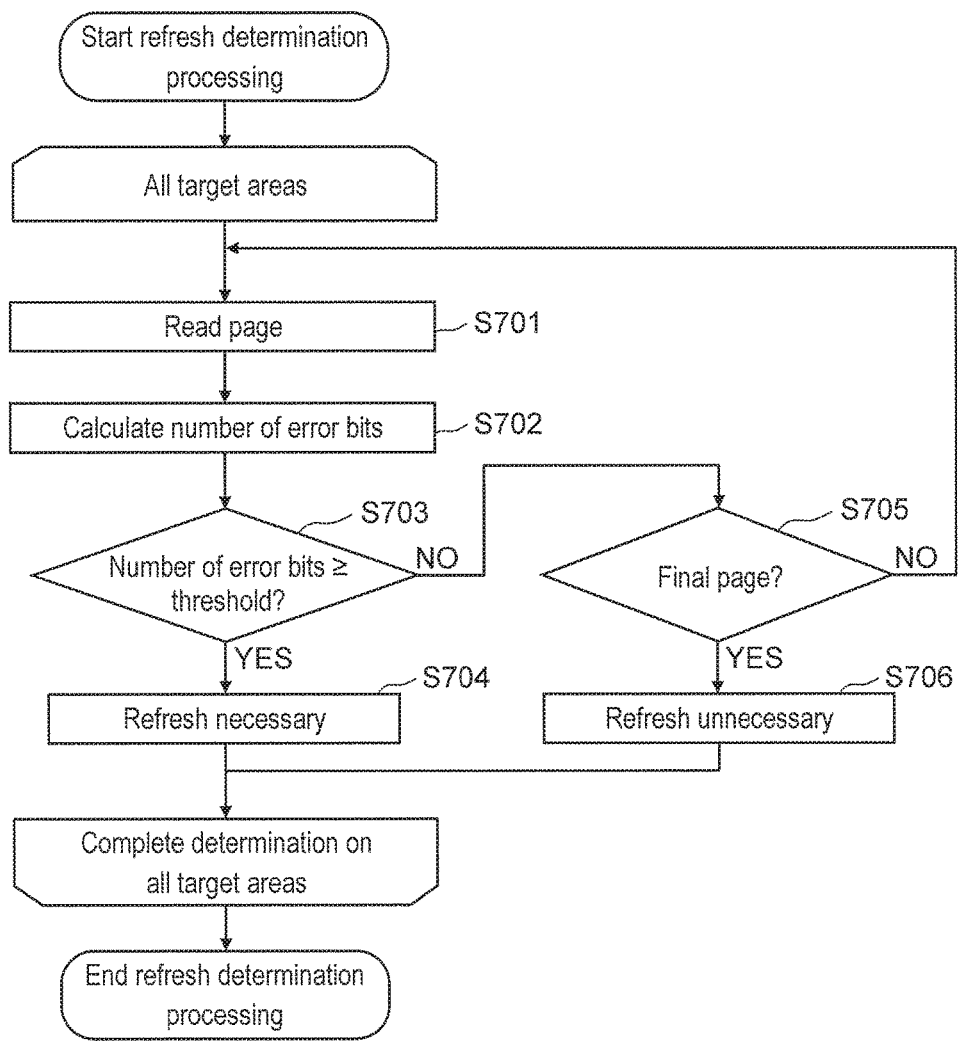
FIG. 7 is a flowchart illustrating refresh determination processing of a refresh determiner in the first exemplary embodiment.

Next, refresh determination processing by refresh determiner 206 will be described. FIG. 7 is a flowchart illustrating refresh determination processing of refresh determiner 206 in this exemplary embodiment. Refresh determiner 206 determines whether refresh of the target area is necessary for each target area in non-volatile memory 105. The refresh determination processing is performed on all target areas in non-volatile memory 105. The following description of the refresh determination processing is processing performed on a single target area.

(S701) Refresh determiner 206 reads page 303, which is a data read unit, for a single target area in non-volatile memory 105, and sets read page 303 as determination target page 303.

(S702) For determination target page 303, refresh determiner 206 causes ECC processor 204 to calculate the number of error bits of data in data section 304 of determination target page 303, using an error correcting code in ECC section 305 of determination target page 303.

(S703) Refresh determiner 206 compares the calculated number of error bits to threshold 403 and determines whether the calculated number of error bits is more than or equal to threshold 403. If the calculated number of error bits is more than or equal to threshold 403 (in the case of YES), the processing proceeds to S704. If the calculated number of error bits is less than threshold 403 (in the case of NO), the processing proceeds to S705.

(S704) Refresh determiner 206 determines that refresh of the target area is necessary.

(S705) Refresh determiner 206 determines whether determination target page 303 is the final page in the target area. If determination target page 303 is the final page in the target area (in the case of YES), the processing proceeds to S706. If determination target page 303 is not the final page in the target area (in the case of NO), the processing returns to S701.

(S706) Refresh determiner 206 determines that refresh of the target area is unnecessary.

The above-described refresh determination processing is performed on all target areas.

[1-2-4. Refresh Execution Processing]

Figure 8:
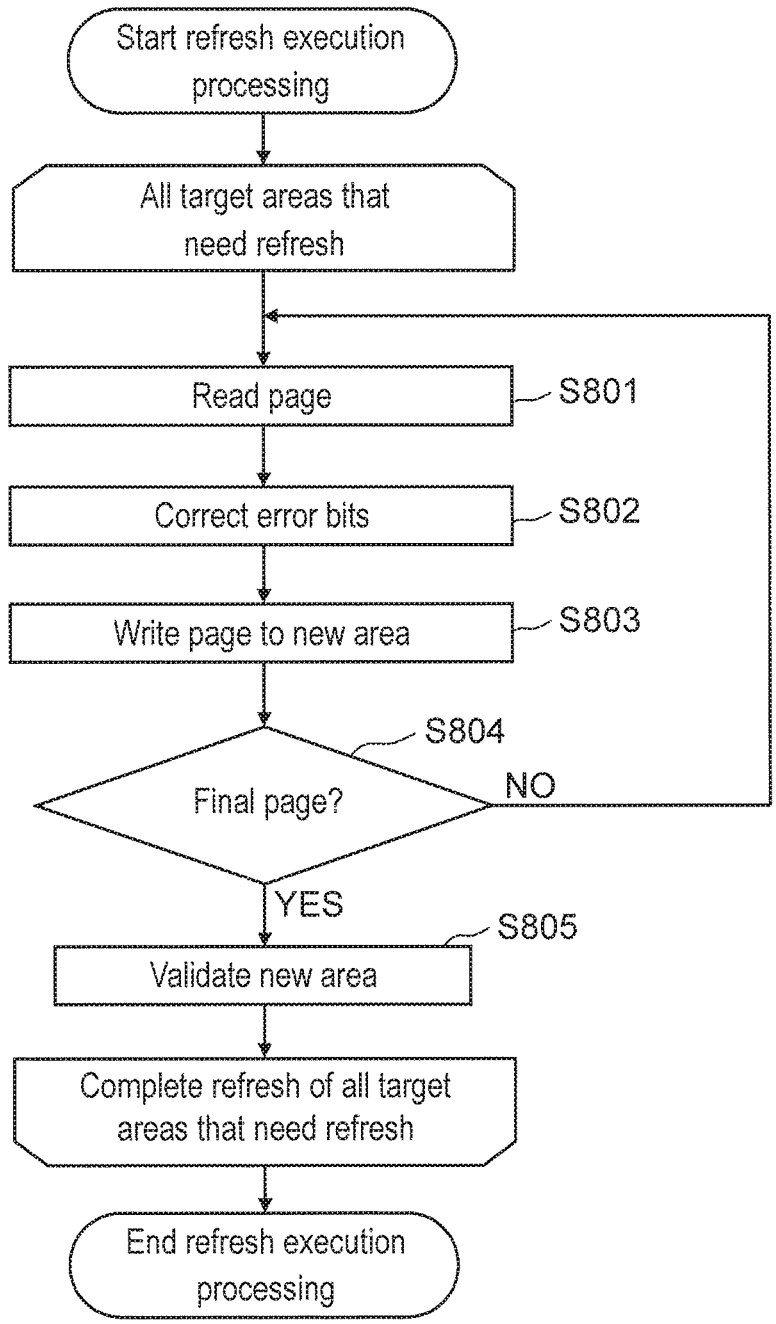
FIG. 8 is a flowchart illustrating refresh execution processing of a refresh executor in the first exemplary embodiment.

Next, refresh execution processing on a target area refresh of which has been determined to be necessary by refresh determiner 206 will be described. FIG. 8 is a flowchart illustrating refresh execution processing of refresh executor 205 in this exemplary embodiment. Refresh executor 205 performs refresh of a target area refresh of which has been determined to be necessary by refresh determiner 206. The refresh execution processing is performed on all target areas refresh of which has been determined to be necessary by refresh determiner 206. The following description of the refresh execution processing is processing executed on a single target area.

(S801) Refresh executor 205 reads page 303, which is a data read unit, for a single target area, and sets read page 303 as execution target page 303.

(S802) For execution target page 303, refresh executor 205 causes ECC processor 204 to correct error bits of data in data section 304 of execution target page 303, using an error correcting code in ECC section 305 of execution target page 303.

(S803) Next, refresh executor 205 causes data controller 203 to write error-corrected data to page 303 in a new area in non-volatile memory 105. Further, refresh executor 205 causes data controller 203 to allocate vacant blocks from which data has been erased to the new area.

(S804) Refresh executor 205 determines whether execution target page 303 is the final page in the target area. If execution target page 303 is the final page in the target area (in the case of YES), the processing proceeds to S805. If execution target page 303 is not the final page in the target area (in the case of NO), the processing returns to S801.

(S805) Refresh executor 205 validates the new area. That is, since physical blocks are allocated to the new area in S803, this new area is made a target area. Thus, memory controller 102 allows the new target area to be controlled.

The above-described refresh execution processing is performed on all target areas refresh of which has been determined to be necessary by refresh determiner 206.

For the refresh determination processing and the refresh execution processing, the refresh execution processing may be performed by refresh executor 205 after the refresh determination processing has been performed on all areas by refresh determiner 206, or the refresh execution processing may be performed by refresh executor 205 each time refresh of a single target area is determined to be necessary in the refresh determination processing by refresh determiner 206.

Threshold calculator 202 and refresh controller 201 may be configured with either hardware or software.

[1-3. Effects]

A non-volatile storage device in this exemplary embodiment includes non-volatile memory configured to have a plurality of areas for storing data, and a memory controller configured to write the data in the non-volatile memory and to read the data from the non-volatile memory. The memory controller includes a memory I/F connected to the non-volatile memory, a threshold calculator calculating a threshold for the number of error bits of the data based on a storage condition in the case of storing the data in the non-volatile memory without power, and a refresh controller determining whether refresh processing of the data is necessary, based on the threshold and the number of error bits of the data, and executing the refresh processing of the data if the refresh processing of the data is necessary.

Further, a memory control method in this exemplary embodiment is a memory control method for non-volatile memory in which data is stored, the method including calculating a threshold for the number of error bits of the data based on a storage condition in the case of storing the data in the non-volatile memory without power, determining whether refresh processing is necessary based on the threshold and the number of error bits of the data, and executing the refresh processing of the data if the refresh processing of the data is necessary.

Therefore, refresh processing of data in non-volatile memory can be executed, according to storage conditions under which the non-volatile memory is to be stored without power. By executing this refresh processing before non-volatile memory is stored without power for a long period, the number of error bits does not exceed an ECC correction limit during the storage period, and data in the non-volatile memory can be retained.

Further, in the non-volatile storage device in this exemplary embodiment, the threshold calculator calculates the threshold for each area of the plurality of the areas of the non-volatile memory.

Furthermore, in the non-volatile storage device in this exemplary embodiment, the storage condition includes importance information of the data contained in the plurality of areas.

Moreover, in the non-volatile storage device in this exemplary embodiment, the non-volatile memory stores number of times of rewriting for each area of the plurality of areas, and the threshold calculator calculates the threshold based on the number of times of rewriting.

Therefore, the non-volatile storage device can calculate a threshold for each area of non-volatile memory and determine whether refresh processing is necessary for each area of the non-volatile memory, so that data degradation can be prevented for each area of the non-volatile memory.

Further, by calculating a threshold based on data importance information as a storage condition, data degradation can be prevented according to the data importance information.

Further, by calculating a threshold based on the number of times of rewriting for each target area, data degradation can be prevented according to the number of times of rewriting for each target area.

Moreover, in the non-volatile storage device in this exemplary embodiment, the storage condition includes at least one of an expected storage period for which the data is stored in the non-volatile memory without power and an expected storage temperature at which the data is stored in the non-volatile memory without power.

Therefore, by calculating a threshold based on an expected storage period for which non-volatile memory is to be stored without power and an expected storage temperature at which the non-volatile memory is to be stored without power, data refresh processing can be executed according to the storage conditions of the non-volatile memory, and data degradation of the non-volatile memory can be prevented.

Further, the non-volatile storage device in this exemplary embodiment further includes an external I/F connected to the access apparatus, and the external I/F receives the storage condition from the access apparatus, and transmits the storage condition to the threshold calculator.

Therefore, a storage condition can be set from an access apparatus as an external device.

Second Exemplary Embodiment

Hereinafter, with reference to FIG. 9, a second exemplary embodiment will be described.

[2-1. Configuration]

Figure 9:
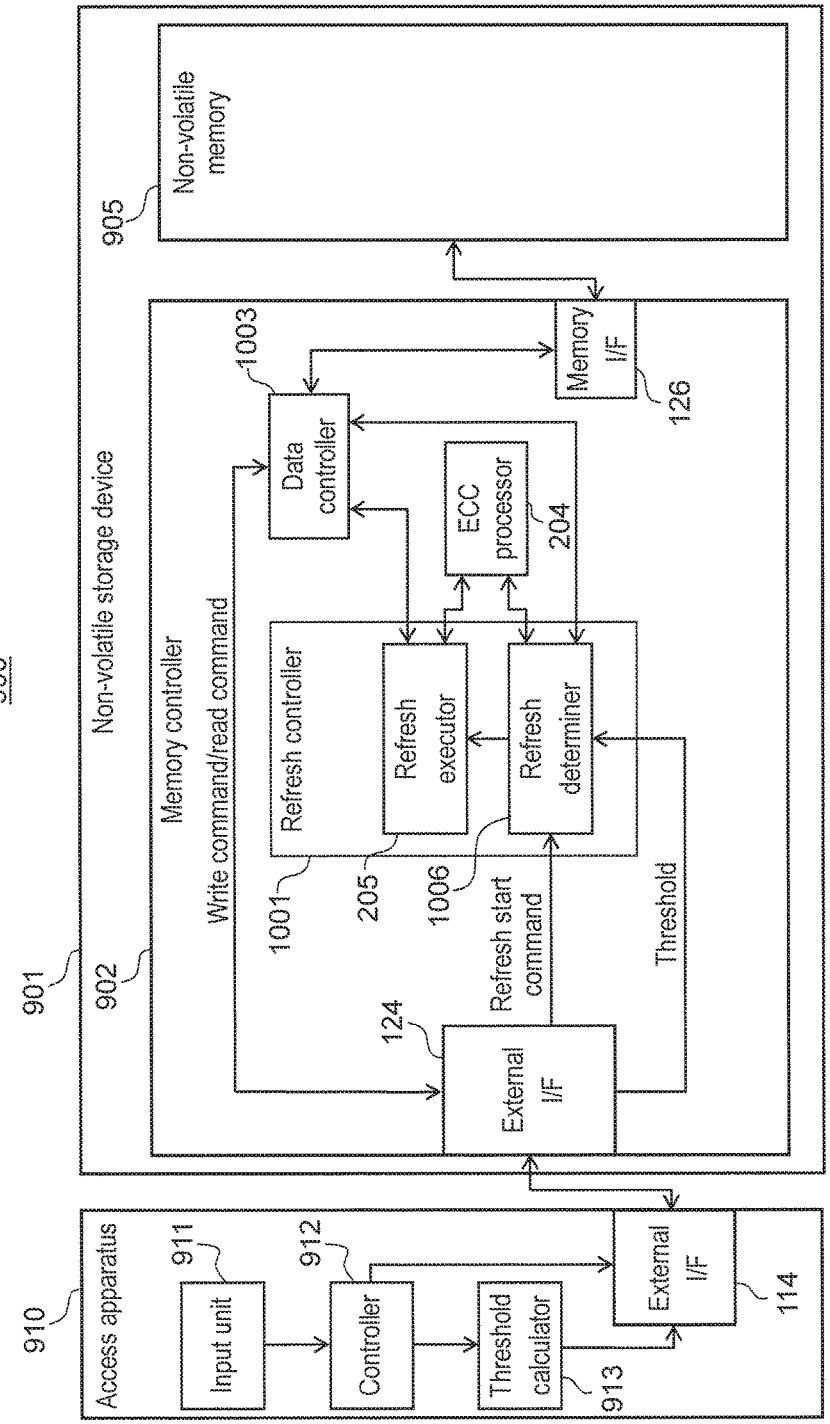
FIG. 9 is a block diagram of a non-volatile storage system in a second exemplary embodiment.

FIG. 9 is a block diagram of non-volatile storage system 900 in the second exemplary embodiment. Non-volatile storage system 900 includes non-volatile storage device 901 and access apparatus 910. A hardware configuration of non-volatile storage device 901 and a hardware configuration of access apparatus 910 are the same as the configurations in the first exemplary embodiment. In the following description, among functions of non-volatile storage device 901 and functions of access apparatus 910, functions different from the functions in the first exemplary embodiment will be described in detail, and the same functions as the functions in the first exemplary embodiment are denoted by the same reference numerals as the reference numerals in the first exemplary embodiment, and will not be described.

Non-volatile storage system 900 in this exemplary embodiment is different from non-volatile storage system 100 in the first exemplary embodiment in that access apparatus 910 performs calculation of threshold.

Access apparatus 910 includes input unit 911, controller 912, threshold calculator 913, and external I/F 114. These functional components of access apparatus 910 are functional components involved in refresh processing, and components involved in other functions are not illustrated. Access apparatus 910 transmits data, a write command of data and a read command of data, and the like to non-volatile storage device 901.

A user enters various commands into access apparatus 910 by input unit 911. The user inputs data, a write command of data and a read command of data, and the like by input unit 911. For refresh processing, a refresh start command and storage conditions described below are entered into input unit 911.

Controller 912 controls a command entered into input unit 911. Specifically, if commands are data, a write command of data and a read command of data, and a refresh start command, controller 912 transmits these commands to non-volatile storage device 901 via external I/F 114. If a command is a storage condition, controller 912 transmits the command to threshold calculator 913.

Threshold calculator 913 calculates a threshold for each target area, based on storage conditions. The storage conditions are conditions under which non-volatile memory 905 in non-volatile storage device 901 is to be stored without power for a long period, and include time information, temperature information, and importance information of a target area.

Non-volatile storage device 901 includes memory controller 902 and non-volatile memory 905. Non-volatile memory 905 is a semiconductor memory, and stores data. Memory controller 902 controls to write data to non-volatile memory 905 and to read data from non-volatile memory 905.

Memory controller 902 includes refresh controller 1001, data controller 1003, ECC processor 204, external I/F 124, and memory I/F 126. Refresh controller 1001 includes refresh executor 205 and refresh determiner 1006.

Non-volatile storage device 901 receives the data, the write command of data and the read command of data, the refresh start command, and the threshold for each target area transmitted from access apparatus 910 to non-volatile storage device 901 via external I/F 124 in memory controller 902.

Data controller 1003 writes data to non-volatile memory 905 and reads data from non-volatile memory 905 via memory I/F 126, and controls non-volatile memory 905.

Refresh determiner 1006 receives the refresh start command and the threshold for each target area via external I/F 124. Refresh determiner 1006 instructs data controller 1003 to read data in a target area in non-volatile memory 905. Based on the instruction from refresh determiner 1006, data controller 1003 reads the data in the target area in non-volatile memory 105 via memory I/F 126, and transmits the read data to refresh determiner 1006. Refresh determiner 1006 determines whether refresh of the data is necessary based on the data in the target area and the threshold for each target area. If refresh of the data in the target area is necessary, refresh determiner 1006 instructs refresh executor 205 to refresh the target area.

Refresh executor 205 performs refresh of the target area.

[2-2. Refresh Processing]

Next, refresh processing of non-volatile storage system 900 in this exemplary embodiment will be described.

[2-2-1. Calculation of Threshold]

Next, a method for calculating a threshold in this exemplary embodiment will be described.

Threshold calculator 913 in access apparatus 910 receives storage conditions. Based on the storage conditions, threshold calculator 913 calculates a threshold for each target area in non-volatile memory 905.

The storage conditions include time information, temperature information, and importance information of a target area. A user sets the storage conditions by input unit 911 in access apparatus 910.

For the time information, an expected storage period for which non-volatile memory 905 in non-volatile storage device 901 is to be stored without power is set. For example, when non-volatile memory 905 in non-volatile storage device 901 is stored in a warehouse without power for one year, "one year" is set.

For the temperature information, an expected storage temperature at which non-volatile memory 905 in non-volatile storage device 901 is to be stored without power is set. For example, when the highest temperature at the location of the warehouse where non-volatile storage device 901 is stored is 35° C., "35° C." is set.

For the importance information of target areas, importance of data contained in a target area is set. When there is data with high importance in a target area, importance of the target area is set higher than importance of other target areas. For example, when importance is set as rank 1, rank 2, . . . , rank 5 in decreasing order of importance, importance of a target area containing data with the highest importance is set to "rank 1."

When non-volatile storage device 901 is divided into a plurality of partitions and managed by access apparatus 910, for example, and importance of a particular partition is high, importance of a target area associated with data of the particular partition is set high.

A threshold may be calculated for each target area, or may be calculated for all or a plurality of target areas collectively.

Data units and target areas may be dynamically associated with each other in a table in which the data units and the target areas are associated with each other. In this case, importance of data contained in a data unit is associated with importance of a target area using this table.

[2-2-2. Refresh Determination Processing]

Next, refresh determination processing by refresh determiner 1006 will be described. Refresh determiner 1006 is different from refresh determiner 206 in the first exemplary embodiment in that a threshold for each target area received is calculated by threshold calculator 913 in access apparatus 910. Refresh determiner 1006 determines whether refresh of a target area is necessary for each target area in non-volatile memory 905. The refresh determination processing is executed on all target areas in non-volatile memory 905.

[2-2-3. Refresh Execution Processing]

Next, refresh execution processing on a target area refresh of which has been determined to be necessary by refresh determiner 1006 will be described. Refresh executor 205 performs refresh of a target area refresh of which has been determined to be necessary by refresh determiner 1006. The refresh execution processing is performed on all target areas refresh of which has been determined to be necessary by refresh determiner 1006. The refresh execution processing by refresh executor 205 is the same processing as the processing in the first exemplary embodiment.

For the refresh determination processing and the refresh execution processing, the refresh execution processing may be performed by refresh executor 205 after the refresh determination processing has been performed on all areas by refresh determiner 1006, or the refresh execution processing may be performed by refresh executor 205 each time refresh of a single target area is determined to be necessary in the refresh determination processing by refresh determiner 1006.

Threshold calculator 913 in access apparatus 910 and refresh controller 1001 in memory controller 902 in non-volatile storage device 901 may be configured with either hardware or software.

[2-3. Effects]

A non-volatile storage system in this exemplary embodiment includes an access apparatus and a non-volatile storage device connected to the access apparatus. The non-volatile storage device includes non-volatile memory having a plurality of areas for storing data, and a memory controller writing to the data to the non-volatile memory and reading the data from the non-volatile memory. The access apparatus calculates a threshold for the number of error bits of the data based on a storage condition in the case of storing the data in the non-volatile memory without power, and transmits the threshold to the non-volatile storage device. The memory controller includes a refresh controller determining whether refresh processing of the data is necessary based on the threshold and the number of error bits of the data, and executing the refresh processing of the data if the refresh processing of the data is necessary.

Therefore, like the effects in the first exemplary embodiment, refresh processing of data in non-volatile memory can be executed, according to storage conditions under which the non-volatile memory is to be stored without power. By executing this refresh processing before non-volatile memory is stored without power for a long period, the number of error bits does not exceed an ECC correction limit during the storage period, and data can be retained.

Further, since an access apparatus in this exemplary embodiment is configured to include a threshold calculator, setting of the threshold calculator can be easily changed, as compared to a case where a threshold calculator is included in a non-volatile storage device.

Other Embodiments

As above, the first and second exemplary embodiments have been described as illustrative examples of the present disclosure. However, the technology in the present disclosure is not limited to them, and is applicable to exemplary embodiments in which change, replacement, addition, omission, or the like has been made as appropriate. Components described in the above first and second exemplary embodiments can be combined into a new exemplary embodiment.

Thus, hereinafter, other exemplary embodiments will be illustrated.

In the first exemplary embodiment, memory controller 102 calculates threshold 403 using time information, temperature information, importance information of a target area, and the number of times of rewriting for each target area in non-volatile memory 105, which is not limiting. Threshold 403 may be calculated using only one or some of them.

In the second exemplary embodiment, access apparatus 910 calculates a threshold using time information, temperature information, and importance information for each target area, which is not limiting. Thresholds may be calculated using only one or some of them.

The hardware configurations of memory controllers 102 and 902 and access apparatuses 110 and 910 described in the first and second exemplary embodiments may be individually implemented on one chip by a semiconductor device such as a Large-Scale Integration (LSI), or may be implemented on one chip to be included partly or entirely. Here, an LSI is mentioned, but depending on difference in the degree of integration or the like, an LSI may alternatively be referred to as an Integrated Circuit (IC), a Very-Large-Scale Integration (VLSI), an Ultra-Large-Scale Integration (ULSI), or a system LSI. A circuit integration technique is not limited to LSI, and may be implemented by a dedicated circuit or a general-purpose processor. A Field Programmable Gate Array (FPGA) that is programmable after the production of an LSI or a reconfigurable processor that is reconfigurable in the connection and setting of circuit cells in an LSI may be used.

The functional blocks in memory controllers 102 and 902 and access apparatuses 110 and 910 described in the first and second exemplary embodiments may be partly or entirely implemented by a program.

The execution sequence of the refresh processing in the first and second exemplary embodiments is not limited to the execution sequence in the exemplary embodiments. The execution sequence may be changed without departing from the scope of the present disclosure.

Memory controller 102, and non-volatile storage device 101 including memory controller 102 and non-volatile memory 105 in the first exemplary embodiment, non-volatile storage system 900 including non-volatile storage device 901 and access apparatus 910 in the second exemplary embodiment, the memory control method including the refresh processing of non-volatile memory 105 and 905 executed in the first and second exemplary embodiments, a computer program to cause a computer to execute the memory control method, and a computer-readable recording medium in which the program is recorded are included in the scope of the present disclosure. Here, examples of the computer-readable recording medium include a flexible disk, a hard disk, a Compact Disk Read-Only Memory (CD-ROM), an Magneto-Optical disk (MO), a Digital Versatile Disk (DVD), DVD Read-Only Memory (DVD-ROM), DVD Random-Access Memory (DVD-RAM), a Blu-ray (registered trademark) Disc (BD), and a semiconductor memory.

The computer program is not limited to a computer program recorded in the recording medium, and may be a computer program transmitted via a telecommunications line, a wireless or wired communications line, a network represented by the Internet, or the like.

What is claimed is:

1. A non-volatile storage device comprising:
   a non-volatile memory configured to have a plurality of areas for storing data; and
   a memory controller configured to write the data to the non-volatile memory and to read the data from the non-volatile memory, the memory controller comprising:
   a memory interface (I/F) connected to the non-volatile memory;
   a threshold calculator for calculating a threshold for the number of error bits of the data based on an expected period for which the non-volatile memory is stored without power; and a refresh controller for determining whether refresh processing of the data is necessary, based on the threshold and the number of error bits of the data, and executing the refresh processing of the data if the refresh processing of the data is necessary.

2. The non-volatile storage device according to claim 1, wherein the threshold calculator calculates the threshold for each area of the plurality of areas of the non-volatile memory.

3. The non-volatile storage device according to claim 1, wherein the expected period for which the non-volatile memory is stored without power is set by a user.

4. The non-volatile storage device according to claim 2, wherein:
the non-volatile memory stores a number of rewriting operation times on each area of the plurality of areas, and
the threshold calculator calculates the threshold based on the number of times of rewriting.

5. A non-volatile storage system comprising:
an access apparatus; and
a non-volatile storage device connected to the access apparatus, the non-volatile storage device including:
a non-volatile memory having a plurality of areas for storing data; and
a memory controller writing to the data to the non-volatile memory and reading the data from the non-volatile memory, wherein:
the access apparatus calculates a threshold for the number of error bits of the data based on an expected period for which the non-volatile memory is stored without power, and transmits the threshold to the non-volatile storage device, and
the memory controller includes a refresh controller determining whether refresh processing of the data is necessary based on the threshold and the number of error bits of the data, and executing the refresh processing of the data if the refresh processing of the data is necessary.

6. The non-volatile storage system according to claim 5, wherein the access apparatus calculates the threshold for each area of the plurality of areas of the non-volatile memory.

7. The non-volatile storage system according to claim 5, wherein the expected period for which the non-volatile memory is stored without power is set by a user.

8. A memory control method for non-volatile memory in which data is stored, the method comprising:
calculating a threshold for the number of error bits of the data based on an expected period for which the non-volatile memory is stored without power;
determining whether refresh processing is necessary based on the threshold and the number of error bits of the data; and
executing the refresh processing of the data if the refresh processing of the data is necessary.

9. The memory control method according to claim 8, wherein the expected period for which the non-volatile memory is stored without power is set by a user.

\* \* \* \* \*